(12) United States Patent
Tian et al.

(10) Patent No.: US 12,610,558 B2
(45) Date of Patent: Apr. 21, 2026

(54) ReRAM DEVICE AND METHOD FOR MANUFACTURING THE SAME

(71) Applicant: Shanghai Huali Microelectronics Corporation, Shanghai (CN)

(72) Inventors: Zhi Tian, Shanghai (CN); Haoyu Chen, Shanghai (CN); Hua Shao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 711 days.

(21) Appl. No.: 17/953,472

(22) Filed: Sep. 27, 2022

(65) Prior Publication Data

US 2023/0136097 A1 May 4, 2023

(30) Foreign Application Priority Data

Nov. 3, 2021 (CN) .......................... 202111292129.0

(51) Int. Cl.
| | |
|---|---|
| *H10B 63/00* | (2023.01) |
| *H10N 70/00* | (2023.01) |
| *H10N 70/20* | (2023.01) |

(52) U.S. Cl.
CPC ........... *H10B 63/80* (2023.02); *H10N 70/063* (2023.02); *H10N 70/24* (2023.02); *H10N 70/841* (2023.02); *H10N 70/8833* (2023.02)

(58) Field of Classification Search
CPC . H10N 70/826; H10N 70/841; H10N 70/8833
See application file for complete search history.

(56) References Cited

U.S. PATENT DOCUMENTS

| | | | | | |
|---|---|---|---|---|---|
| 8,325,507 | B2 * | 12/2012 | Yang | ...................... | H10B 63/80 |
| | | | | | 257/E27.047 |
| 11,770,987 | B2 * | 9/2023 | Yu | ........................ | H10N 70/011 |
| | | | | | 365/148 |

* cited by examiner

*Primary Examiner* — Mark V Prenty
(74) *Attorney, Agent, or Firm* — Banner & Witcoff, Ltd.

(57) ABSTRACT

The present application discloses a ReRAM device, the bottom surface of a first resistance switching layer is connected with a bottom electrode, and a first groove is formed in the center of the top surface of the first resistance switching layer. A second resistance switching layer is formed on the first resistance switching layer, the center of the bottom surface of the second resistance switching layer is filled downwards into the first groove, and the top surface of the second resistance switching layer is connected with a top electrode. The material of the second resistance switching layer is more conductive than the material of the first resistance switching layer. The present application can maintain the stability of the central conductive filament in the low resistance state. The present application further discloses a method for manufacturing the ReRAM device.

9 Claims, 8 Drawing Sheets

Top electrode

Resistance switching
layer

Bottom electrode

ReRAM DEVICE AND METHOD FOR MANUFACTURING THE SAME

CROSS-REFERENCE TO RELATED APPLICATIONS

This application claims the priority to Chinese Patent Application No. 202111292129.0, filed on Nov. 3, 2021, the disclosure of which is incorporated herein by reference in its entirety.

TECHNICAL FIELD

The present application relates to a semiconductor technology, in particular to a Resistive RAM (ReRAM) device and a method for manufacturing the same.

BACKGROUND

Flash memory has been widely used as the best choice for nonvolatile memory applications because of its advantages of high density, low price, and electrical programmability and erasability. At present, flash memory cells are mainly at 65 nm technology node. With the requirement for high-capacity flash memories, the number of chips on each silicon chip will be reduced by using the existing technology node. At the same time, the floating gate based flash memory cell (NOR flash) will encounter problems in continuous reduction, including balance between the hot electron effect for programming in the channel direction and the leakage of subsequent cells, the voltage and current instability caused by the active region with smaller width, and the subsequent tolerance for data retention and endurance, which have a serious influence. With the development of technology, many alternatives have followed, including Resistive Random Access Memory (ReRAM) based on the change of resistance due to film properties, Magnetoresistive Random Access Memory (MRAM) based on the change of magnetoresistance, Ferroelectric Random Access Memory (Fe-RAM) based on ferroelectricity, and Parameter Random Access Memory (PRAM) based on the change of polymer properties, all of which are actively researched and developed to replace the position of floating gate in the existing node. Among these technologies, ReRAM based on the change of resistance due to film properties is the most promising structure, which has the advantages of low power consumption, fast writing speed and good endurance.

A simple ReRAM device, as illustrated in FIG. 1, is a Metal-Insulator-Metal (MIM) structure formed by sandwiching a resistance switching layer capable of realizing resistance switching between a top electrode and a bottom electrode. This MIM structure cell can realize the reversible switching between at least two different resistance states after applying certain voltage, namely, High Resistance State (HRS) and Low Resistance State (LRS). When the voltage is applied for the first time, due to the existence of the dielectric layer, the initial state is HRS. When the voltage is scanned to a certain condition, the resistance of the dielectric layer switches from FIRS to LRS. This process is called forming. Forming process is the process that the resistance of the device changes for the first time. When the voltage is applied again, the resistance of the dielectric layer returns to FIRS again from LRS, which is called reset. The subsequent resistance switching from FIRS to LRS is called set. The set process implements the writing function of data (from '0' to '1'), and the reset process implements the clearing function of data (from '1' to '0'), thus completing the basic function of storage.

Tantalum oxide thin films have attracted extensive attention due to their excellent endurance. The good endurance of tantalum oxide is due to its two stable states, $TaO_2$ (more conductive) and $Ta_2O_5$ (more insulative). The data retention capability of the ReRAM device refers to whether the resistance of the resistance state can remain unchanged after the resistance of the device changes, which represents the length of the service life of the device.

A memory array structure consisting of ReRAM devices is as illustrated in FIG. 2. A memory cell structure consisting of a ReRAM device is as illustrated in FIG. 3. One component is a transistor and the other is a ReRAM device, which form a 1T1R structure. A gate of the transistor is used to connect a word line WL, a source is used to connect a source line SL, a drain is connected to the bottom electrode of the ReRAM device, and the top electrode of the ReRAM device is used to connect a bit line BL.

The resistance of the ReRAM device is operated by the current of the transistor. The principle of its resistance change is as illustrated in FIG. 4. The resistance change of the ReRAM is mainly explained according to the conductive film channel. There are oxygen vacancies and oxygen ions affected by the electric field in the film. After first forming, there will be a Conductive Filament (CF), similar to the UV of NOR flash. In the set process, oxygen ions leave their original positions, leaving oxygen vacancies (Vo) in the film, forming a low resistance state that can allow large current to pass through. When reverse voltage is applied, these oxygen ions recombine with oxygen vacancies (Vo) to form oxygen atoms, thus forming a state of high resistance and low current, and completing resetting. For the low resistance state, oxygen vacancies in the conductive thin layer are filled with the original oxygen ions after a long time, and on the other hand, it is vulnerable to the influence of nearby free oxygen to reduce the density, so that the resistance increases and the current decreases. In order to improve the stability, the relationship between the dimension of the conductive thin layer and the data retention capability is studied. It is found that the dimension of the smaller CF has a larger number N of oxygen vacancies (Vo) under the same conductivity, which has better reliability.

BRIEF SUMMARY

The technical problem to be solved by the present application is to provide a Resistive RAM (ReRAM) device, which can maintain the stability of the central conductive filament in the low resistance state.

In order to solve the technical problem, the ReRAM device provided by the present application includes a first resistance switching layer 5, a second resistance switching layer 6, a bottom electrode 1 and a top electrode 2;

a bottom surface of the first resistance switching layer 5 is connected with the bottom electrode 1, and a first groove is formed in a center of a top surface;

the second resistance switching layer 6 is formed on the first resistance switching layer 5, a center of a bottom surface of the second resistance switching layer 6 is filled downwards into the first groove in the center of the top surface of the first resistance switching layer 5, and a top surface of the second resistance switching layer 6 is connected with the top electrode 2;

the material of the second resistance switching layer 6 is more conductive than the material of the first resistance switching layer 5.

Further, the first resistance switching layer 5 is $SrTiO_3$, $SrZrO_3$, $NiO$, $TiO_2$, $TaO$, $TaO_2$, $Ta_2O_6$, $Ta_2O_5$, $Ta_2O_4$, $Ta_2O_3$, $Ta_2O_2$ or $Ta_2O$;

the second resistance switching layer 6 is $SrTiO_3$, $SrZrO_3$, $NiO$, $TiO_2$, $TaO$, $TaO_2$, $Ta_2O_6$, $Ta_2O_5$, $Ta_2O_4$, $Ta_2O_3$, $Ta_2O_2$ or $Ta_2O$.

Further, a second groove is formed in a center of the top surface of the second resistance switching layer 6;

the transverse dimension of the second groove is smaller than the transverse dimension of the first groove and the second groove is located right above the first groove;

the top electrode 2 is filled downwards into the second groove in the center of the top surface of the second resistance switching layer 6.

Further, the first resistance switching layer 5 is $Ta_2O_6$, $Ta_2O_5$, $Ta_2O_4$, $Ta_2O_3$, $Ta_2O_2$ or $Ta_2O$;

the second resistance switching layer 6 is $TaO_2$ or $TaO$.

Further, the depth of the first groove is ½-⅘ of the thickness H1 of the first resistance switching layer 5;

the thickness H2 of the part outside the first groove of the second resistance switching layer 6 is 1-1.5 times the depth of the first groove.

Further, the depth of the second groove is ½-⅘ of the thickness H2 of the second resistance switching layer.

Further, the transverse dimension of the second groove is ⅓-⅔ of the transverse dimension of the first groove.

Further, the thickness of the first resistance switching layer is 3 nm-30 nm.

Further, the material of a surface of the top electrode 2 in contact with the top surface of the second resistance switching layer 6 is Ag, Pt, Ta, Ti or TiN;

the material of a surface of the bottom electrode 1 in contact with the bottom surface of the first resistance switching layer 5 is Ag, Pt, Ta, Ti or TiN.

In order to solve the technical problem, the present application further provides a method for manufacturing the ReRAM device, which includes the following steps:

step 1: performing a metal layer process to form a metal layer 11 of a bottom electrode 1 of the ReRAM device on a wafer 9, the wafer 9 outside a central area of the metal layer 11 of the bottom electrode 1 of the ReRAM device being covered with an isolation dielectric layer 3;

step 2: sequentially depositing a bottom electrode contact surface layer 12 and a first resistance switching layer 5 on the metal layer 11 of the bottom electrode 1 of the ReRAM device and the isolation dielectric layer 3, a first groove being formed in the first resistance switching layer 5 right above the bottom electrode 1;

step 3: depositing a second resistance switching layer 6;

step 4: performing etching to remove the second resistance switching layer 6, the first resistance switching layer 5 and the bottom electrode contact surface layer 12 which cover the isolation dielectric layer 3 outside the metal layer 11 of the bottom electrode 1 and an adjoining area thereof, and reserve the second resistance switching layer 6, the first resistance switching layer 5 and the bottom electrode contact surface layer 12 which cover positions right above the metal layer 11 of the bottom electrode 1 and the adjoining area thereof;

step 5: depositing a top electrode contact surface layer 22;

step 6: performing etching to remove the top electrode contact surface layer 22 on outer sides of the second resistance switching layer 6, the first resistance switching layer 5 and the bottom electrode contact surface layer 12.

Further, after step 2, the first resistance switching layer 5 in the center right above the metal layer 11 of the bottom electrode 1 is etched firstly to widen the transverse dimension of the first groove and/or deepen the depth of the first groove, and then step 3 is performed.

Further, the isolation dielectric layer 3 is SiN;

the first resistance switching layer 5 is $Ta_2O_6$, $Ta_2O_5$, $Ta_2O_4$, $Ta_2O_3$, $Ta_2O_2$ or $Ta_2O$;

the second resistance switching layer is $TiO_2$ or $TaO$;

the bottom electrode contact surface layer 12 is formed of Ta, Ti or TiN;

the top electrode contact surface layer 22 is formed of Ta, Ti or TiN.

In the ReRAM device provided by the present application, the second resistance switching layer is formed on the first resistance switching layer, and the center of its bottom surface extends downwards and is filled into the first groove in the center of the top surface of the first resistance switching layer; the material of the second resistance switching layer is more conductive than the material of the first resistance switching layer. Starting from the structural aspect to improve the stability of the low resistance state, by forming the "concave" first resistance switching layer, the area most likely to form the conductive filament is in the central area of the resistance switching layer, which is not vulnerable to the influence of surrounding ions. The first resistance switching layer surrounds the downwards extending part of the center of the bottom surface of the second resistance switching layer. Since the first resistance switching layer is less conductive and the thickness of the surrounding part is larger than that of the central part, the surrounding part of the first resistance switching layer is difficult to be conducted completely, but it can effectively adsorb the surrounding ions. Therefore, each set can form incompletely conducted vacancies around the conductive filament, which can continuously adsorb the surrounding ions, thus maintaining the stability of the central conductive filament in the low resistance state, and solving the problem that the conductive thin layer (resistance switching layer) of the existing ReRAM device is vulnerable to the influence of surrounding ions, which makes the low resistance state unstable.

BRIEF DESCRIPTION OF THE DRAWINGS

In order to more clearly describe the technical solution of the present application, the drawings required for the present application will be briefly introduced below. It is obvious that the drawings in the following description are only some embodiments of the present application. Those skilled in the art may obtain other drawings based on these drawings without contributing any inventive labor.

DESCRIPTION OF REFERENCE SIGNS

5—first resistance switching layer; 6—second resistance switching layer; 1—bottom electrode; 2—top electrode; 3—isolation dielectric layer; 9—wafer; 11—bottom electrode metal layer; 12—bottom electrode contact surface layer; 22—top electrode contact surface layer.

DETAILED DESCRIPTION

The technical solution of the present application will be clearly and completely described below with reference to the drawings. Obviously, the described embodiments are part of the embodiments of the present application, not all of them. Based on the embodiments of the present application, all other embodiments obtained by those skilled in the art without contributing any inventive labor still fall within the scope of protection of the present application.

Embodiment 1

Figure 1:
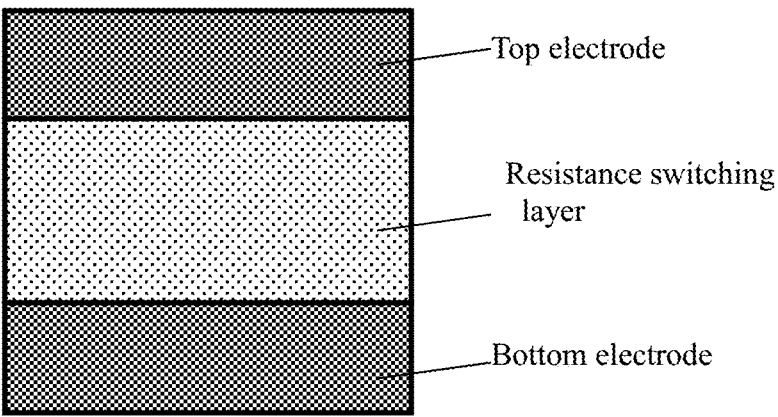
FIG. 1 illustrates a schematic diagram of a structure of a common ReRAM device.
Figure 2:
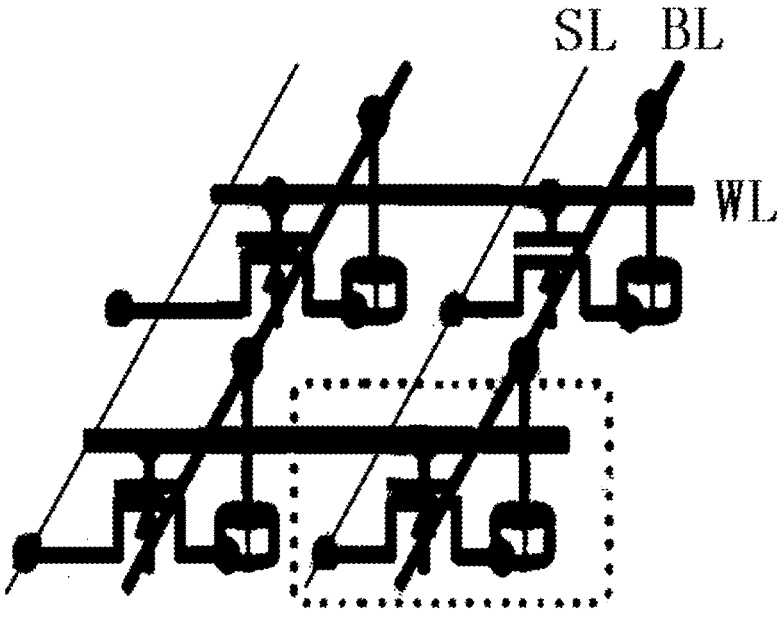
FIG. 2 illustrates a schematic diagram of a structure of a memory array formed by ReRAM.
Figure 3:
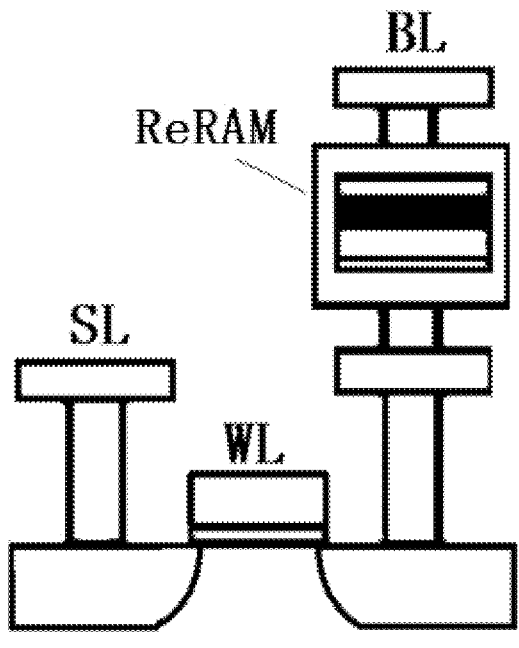
FIG. 3 illustrates a schematic diagram of a structure of a memory cell formed by a ReRAM device.
Figure 4:
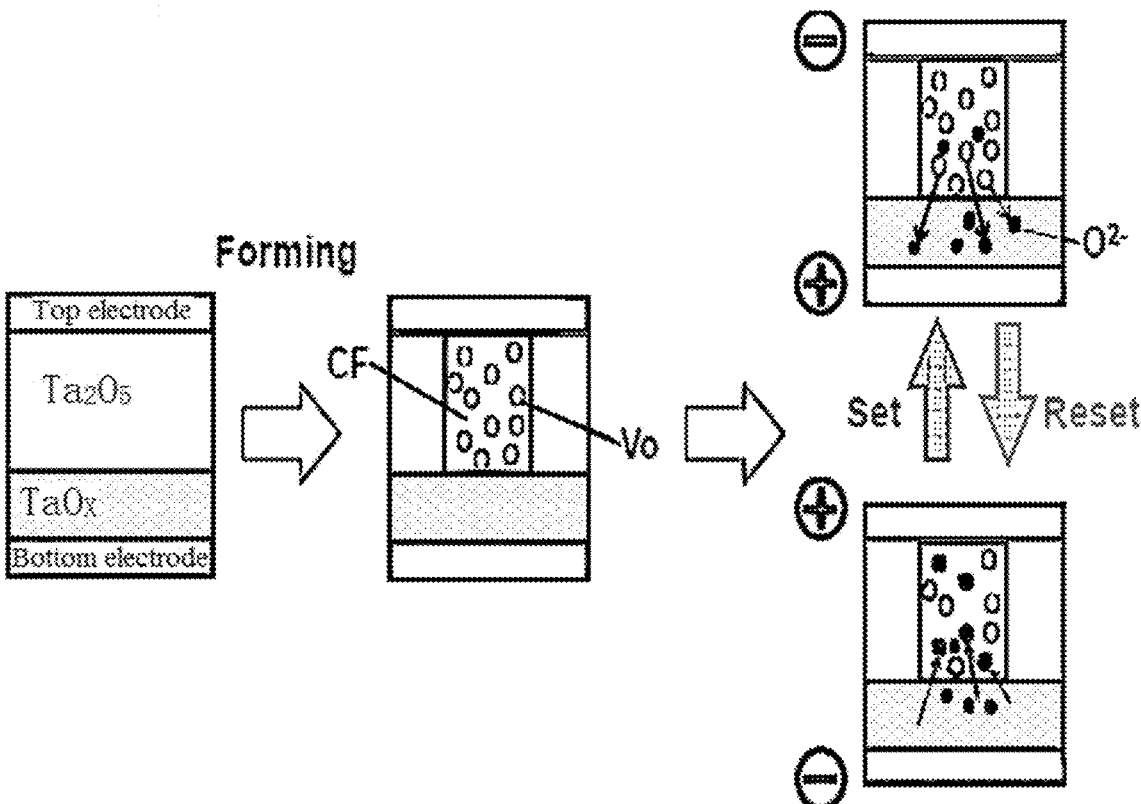
FIG. 4 illustrates a schematic diagram of resistance change of a common ReRAM device.
Figure 5:
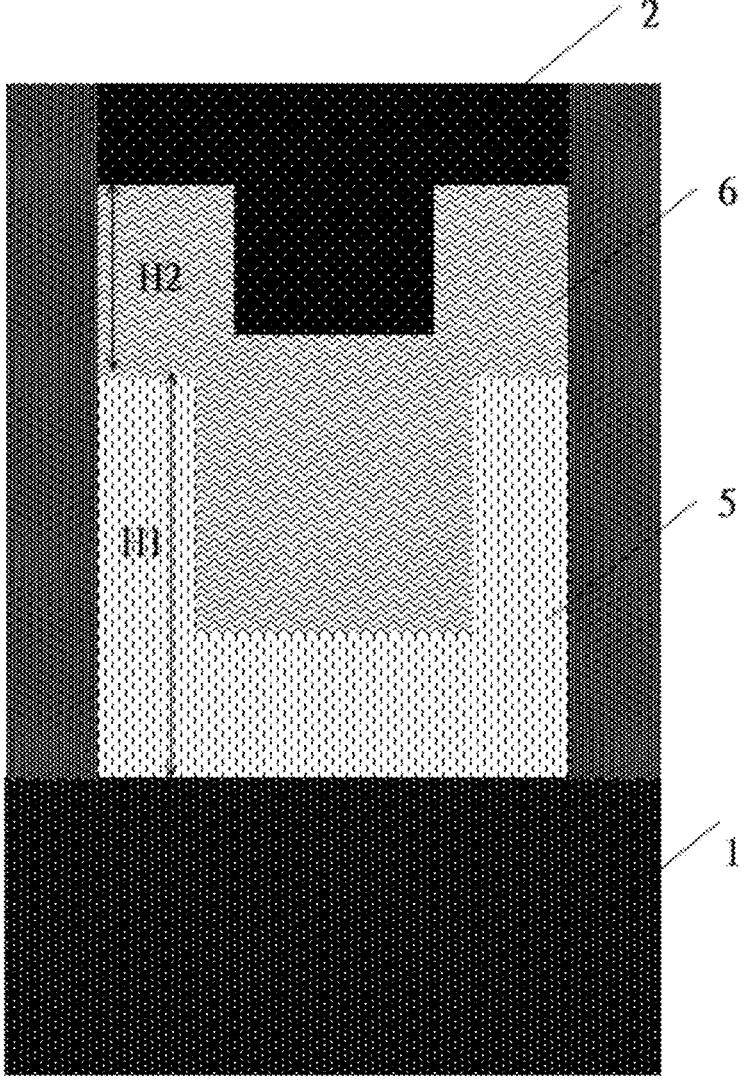
FIG. 5 illustrates a schematic diagram of a structure of a ReRAM device according to an embodiment of the present application.
Figure 6:
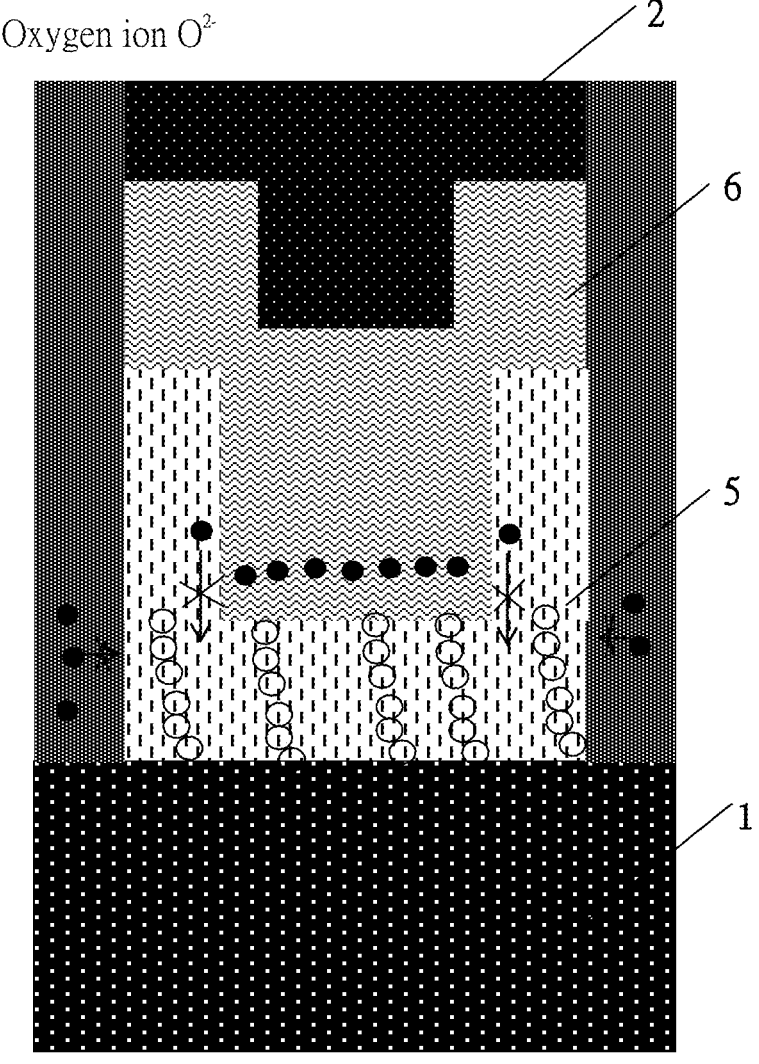
FIG. 6 illustrates a schematic diagram of a structure of a ReRAM device in a low resistance state according to an embodiment of the present application.

Referring to FIG. 5 and FIG. 6, a Resistive RAM (ReRAM) device includes a first resistance switching layer 5, a second resistance switching layer 6, a bottom electrode 1 and a top electrode 2;

a bottom surface of the first resistance switching layer 5 is connected with the bottom electrode 1, and a first groove is formed in a center of a top surface;

the second resistance switching layer 6 is formed on the first resistance switching layer 5, a center of a bottom surface of the second resistance switching layer 6 is filled downwards into the first groove in the center of the top surface of the first resistance switching layer 5, and a top surface of the second resistance switching layer 6 is connected with the top electrode 2;

the material of the second resistance switching layer 6 is more conductive than the material of the first resistance switching layer 5.

Further, the first resistance switching layer 5 is $SrTiO_3$, $SrZrO_3$, $NiO$, $TiO_2$, $TaO$, $TaO_2$, $Ta_2O_6$, $Ta_2O_5$, $Ta_2O_4$, $Ta_2O_3$, $Ta_2O_2$ or $Ta_2O$.

Further, the second resistance switching layer 6 is $SrTiO_3$, $SrZrO_3$, $NiO$, $TiO_2$, $TaO$, $TaO_2$, $Ta_2O_6$, $Ta_2O_5$, $Ta_2O_4$, $Ta_2O_3$, $Ta_2O_2$ or $Ta_2O$.

In the ReRAM device according to embodiment 1, the second resistance switching layer is formed on the first resistance switching layer, and the center of its bottom surface extends downwards and is filled into the first groove in the center of the top surface of the first resistance switching layer; the material of the second resistance switching layer is more conductive than the material of the first resistance switching layer. Starting from the structural aspect to improve the stability of the low resistance state, by forming the "concave" first resistance switching layer, the area most likely to form the conductive filament is in the central area of the resistance switching layer, which is not vulnerable to the influence of surrounding ions. The first resistance switching layer surrounds the downwards extending part of the center of the bottom surface of the second resistance switching layer. Since the first resistance switching layer is less conductive and the thickness of the surrounding part is larger than that of the central part, the surrounding part of the first resistance switching layer is difficult to be conducted completely, but it can effectively adsorb the surrounding ions. Therefore, each set can form incompletely conducted vacancies around the conductive filament, which can continuously adsorb the surrounding ions, thus maintaining the stability of the central conductive filament in the low resistance state, and solving the problem that the conductive thin layer (resistance switching layer) of the existing ReRAM device is vulnerable to the influence of surrounding ions, which makes the low resistance state unstable.

Embodiment 2

Based on the ReRAM device according to embodiment 1, a second groove is formed in a center of the top surface of the second resistance switching layer 6;

the transverse dimension of the second groove is smaller than the transverse dimension of the first groove and the second groove is located right above the first groove;

the top electrode 2 is filled downwards into the second groove in the center of the top surface of the second resistance switching layer 6.

In the ReRAM device according to embodiment 2, the center of the bottom surface of the second resistance switching layer 6 extends downwards and is filled into the first groove in the center of the top surface of the first resistance switching layer 5, and the top electrode 2 is filled downwards into the second groove in the center of the top surface of the second resistance switching layer 6. By forming the "concave" first resistance switching layer 5 and second resistance switching layer 6, it is ensured that the area most likely to form the conductive filament is in the center of the resistance switching layer, thus avoiding the influence of surrounding ions.

Embodiment 3

Based on the ReRAM device according to embodiment 2, referring to FIG. 5, the first resistance switching layer 5 is $Ta_2O_6$, $Ta_2O_5$, $Ta_2O_4$, $Ta_2O_3$, $Ta_2O_2$ or $Ta_2O$;

the second resistance switching layer 6 is $TaO_2$ or $TaO$.

Further, the depth of the first groove is ½-⅘ of the thickness H1 of the first resistance switching layer 5;

the thickness H2 of the part outside the first groove of the second resistance switching layer 6 is 1-1.5 times the depth of the first groove.

Further, the depth of the second groove is ½-⅘ of the thickness H2 of the second resistance switching layer.

Further, the transverse dimension of the second groove is ⅓-⅔ of the transverse dimension of the first groove.

Further, the thickness of the first resistance switching layer is 3 nm-30 nm.

Further, the material of a surface of the top electrode 2 in contact with the top surface of the second resistance switching layer 6 is Ag, Pt, Ta, Ti or TiN;

the material of a surface of the bottom electrode 1 in contact with the bottom surface of the first resistance switching layer 5 is Ag, Pt, Ta, Ti or TiN.

In the ReRAM device according to embodiment 3, the first resistance switching layer 5 surrounds the downwards extending part of the center of the bottom surface of the second resistance switching layer 6. Since the first resistance switching layer 5 is less conductive and the thickness of the surrounding part is larger than that of the central part, the surrounding part of the first resistance switching layer 5 is difficult to be conducted completely, but it can effectively adsorb the surrounding ions. Therefore, referring to FIG. 6, each set can form incompletely conducted vacancies around the conductive filament, which can continuously adsorb the surrounding ions, thus maintaining the stability of the central conductive filament in the low resistance state, and solving the problem that the conductive thin layer of the existing ReRAM device is vulnerable to the influence of surrounding ions, which makes the low resistance state unstable.

Embodiment 4

Figure 7:
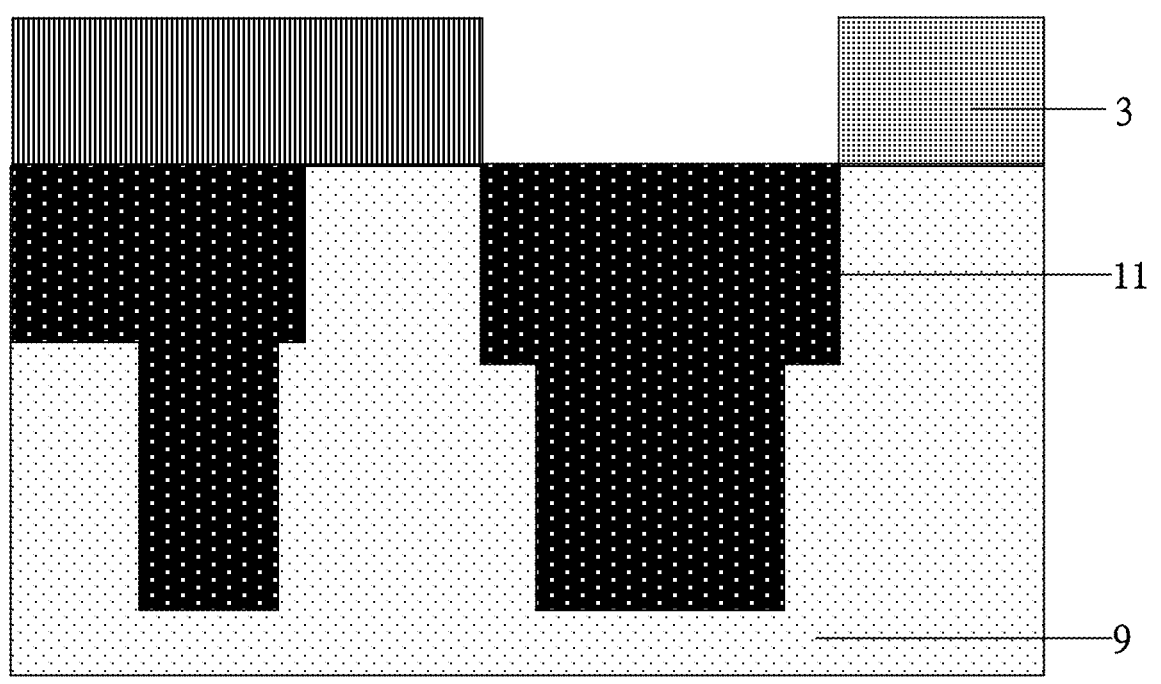
FIG. 7 illustrates a schematic diagram of a metal layer of a bottom electrode formed by adopting a method for manufacturing a ReRAM according to an embodiment of the present application.
Figure 8:
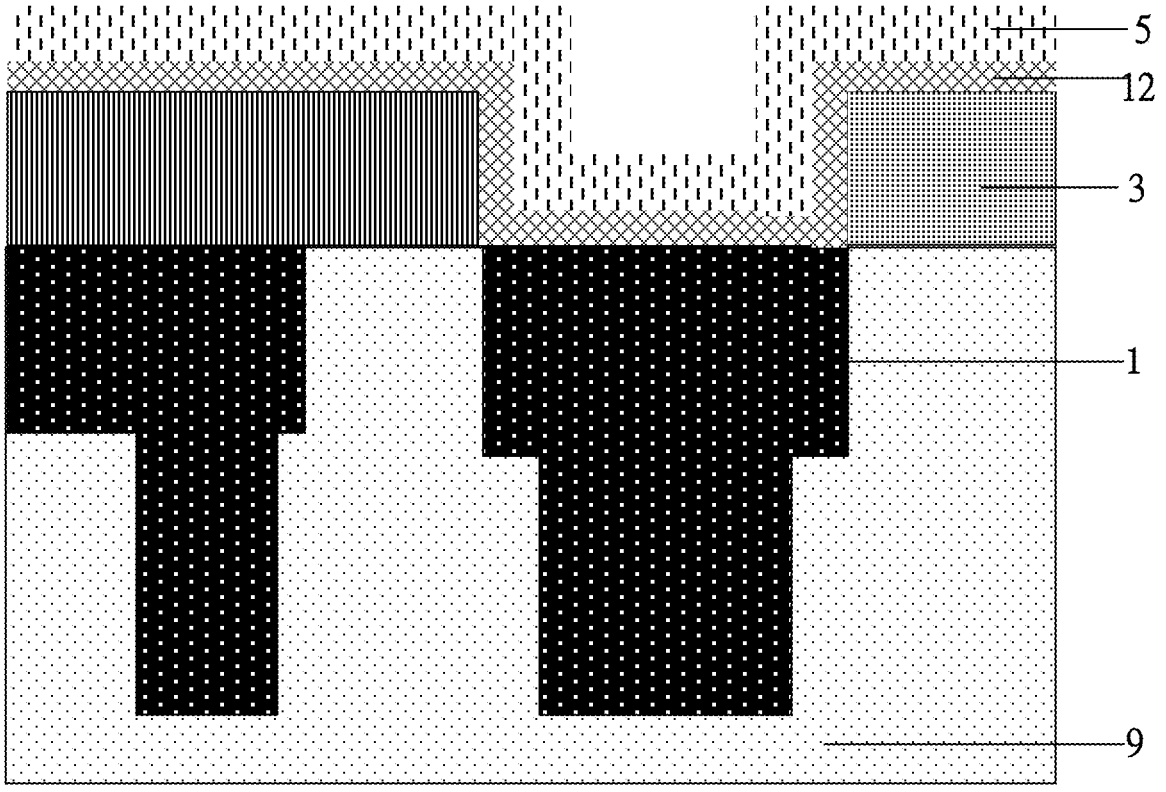
FIG. 8 illustrates a schematic diagram in a step of sequentially depositing a bottom electrode contact surface layer and a first resistance switching layer in a method for manufacturing a ReRAM according to an embodiment of the present application.
Figure 9:
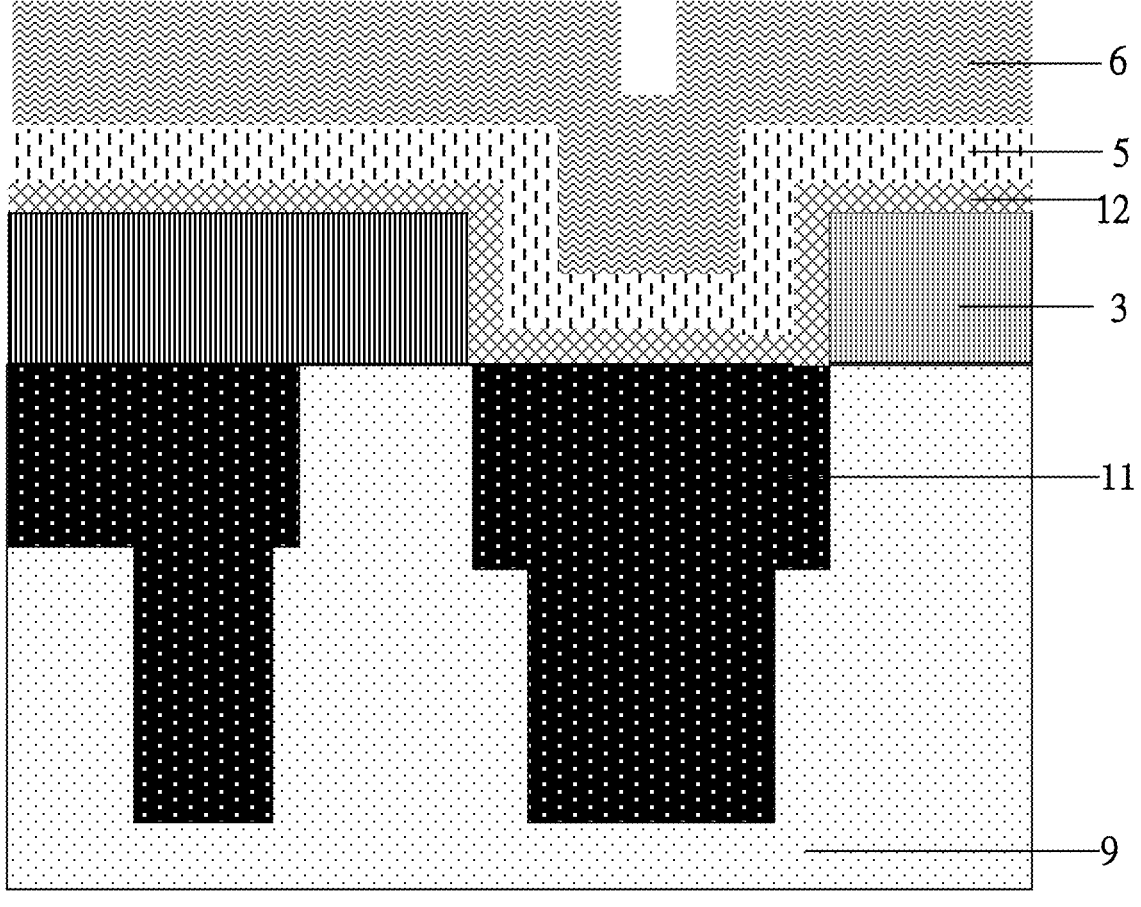
FIG. 9 illustrates a schematic diagram in a step of depositing a second resistance switching layer in a method for manufacturing a ReRAM according to an embodiment of the present application.
Figure 10:
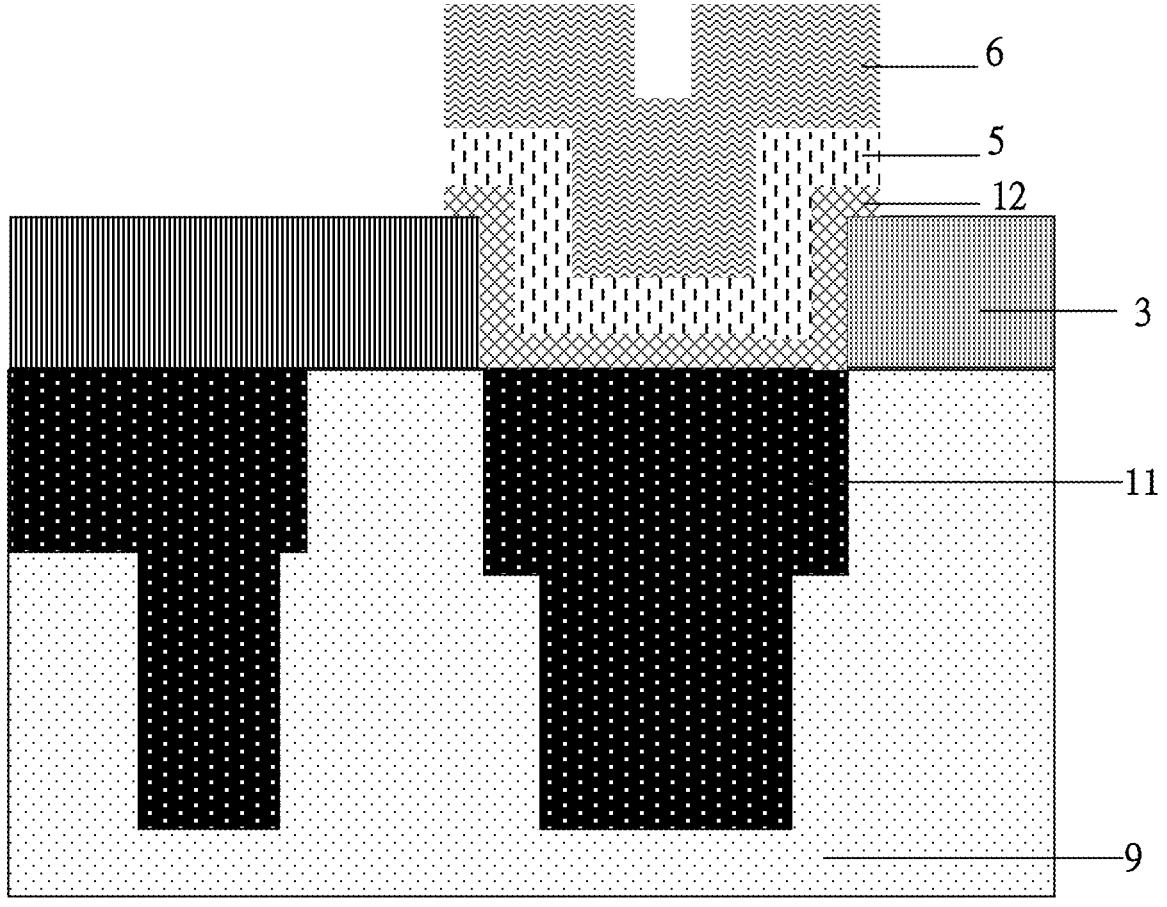
FIG. 10 illustrates a schematic diagram in a step of forming a resistance switching layer in a method for manufacturing a ReRAM according to an embodiment of the present application.
Figure 11:
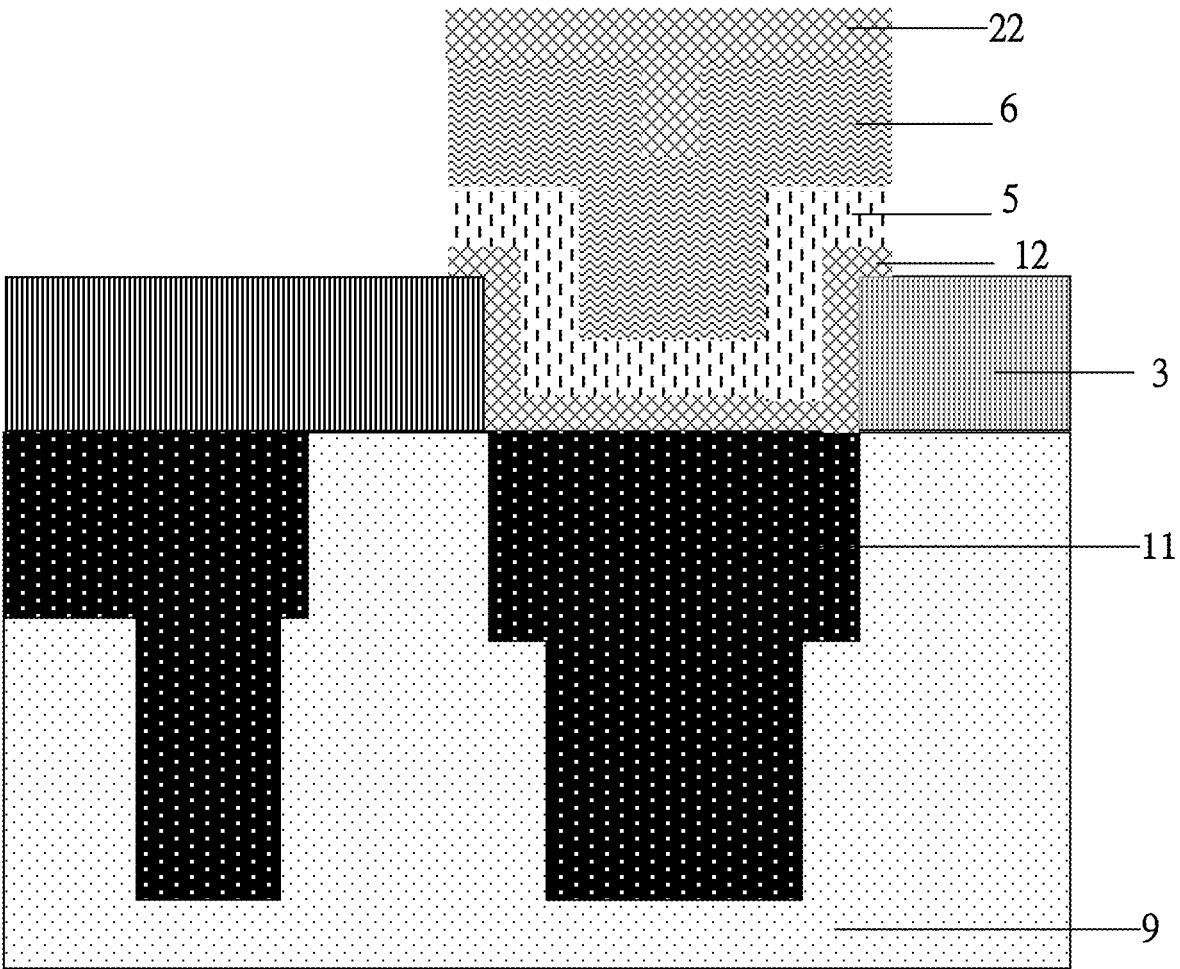
FIG. 11 illustrates a schematic diagram in a step of forming a top electrode contact surface layer in a method for manufacturing a ReRAM according to an embodiment of the present application.

A method for manufacturing the ReRAM device according to any one of embodiments 1-3 includes the following steps:

step 1: performing a metal layer process to form a metal layer 11 of a bottom electrode 1 of the ReRAM device on a wafer 9, the wafer 9 outside a central area of the metal layer 11 of the bottom electrode 1 of the ReRAM device being covered with an isolation dielectric layer 3, as illustrated in FIG. 7;

step 2: sequentially depositing a bottom electrode contact surface layer 12 and a first resistance switching layer 5 on the metal layer 11 of the bottom electrode 1 of the ReRAM device and the isolation dielectric layer 3, a first groove being formed in the first resistance switching layer 5 right above the bottom electrode 1, as illustrated in FIG. 8;

step 3: depositing a second resistance switching layer 6, as illustrated in FIG. 9;

step 4: performing etching to remove the second resistance switching layer 6, the first resistance switching layer 5 and the bottom electrode contact surface layer 12 which cover the isolation dielectric layer 3 outside the metal layer 11 of the bottom electrode 1 and an adjoining area thereof, and reserve the second resistance switching layer 6, the first resistance switching layer 5 and the bottom electrode contact surface layer 12 which cover positions right above the metal layer 11 of the bottom electrode 1 and the adjoining area thereof, as illustrated in FIG. 10;

step 5: depositing a top electrode contact surface layer 22;

step 6: performing etching to remove the top electrode contact surface layer 22 on outer sides of the second resistance switching layer 6, the first resistance switching layer 5 and the bottom electrode contact surface layer 12, as illustrated in FIG. 11.

Further, after step 2, the first resistance switching layer 5 in the center right above the metal layer 11 of the bottom electrode 1 is etched firstly to widen the transverse dimension of the first groove and/or deepen the depth of the first groove, and then step 3 is performed.

Further, the isolation dielectric layer 3 is SiN.

Further, the first resistance switching layer 5 is $Ta_2O_6$, $Ta_2O_5$, $Ta_2O_4$, $Ta_2O_3$, $Ta_2O_2$ or $Ta_2O$;

the second resistance switching layer is $TiO_2$ or TaO.

Further, the bottom electrode contact surface layer 12 is formed of Ta, Ti or TiN;

the top electrode contact surface layer 22 is formed of Ta, Ti or TiN.

What are described above are only preferred embodiments of the present application, which, however, are not used to limit the present application. Any modification, equivalent replacement, improvement and the like made within the essence and principle of the present application shall be included in the scope of protection of the present application.

What is claimed is:

1. A resistive random access memory (ReRAM) device, wherein the ReRAM device comprises a first resistance switching layer, a second resistance switching layer, a bottom electrode, and a top electrode;

a bottom surface of the first resistance switching layer is connected with the bottom electrode, and a first groove is formed in a center of a top surface of the first resistance switching layer;

the second resistance switching layer is formed on the first resistance switching layer, a center of a bottom surface of the second resistance switching layer is filled downwards into the first groove in the center of the top surface of the first resistance switching layer, and a top surface of the second resistance switching layer is connected with the top electrode;

a material of the second resistance switching layer is more conductive than a material of the first resistance switching layer;

a second groove is formed in a center of the top surface of the second resistance switching layer;

a transverse dimension of the second groove is smaller than a transverse dimension of the first groove and the second groove is located right above the first groove;

the top electrode is filled downwards into the second groove in the center of the top surface of the second resistance switching layer;

the transverse dimension of the second groove is ⅓-⅔ of the transverse dimension of the first groove; and a thickness of the first resistance switching layer is 3 nm-30 nm.

2. The ReRAM device according to claim 1, wherein the first resistance switching layer is $SrTiO_3$, $SrZrO_3$, NiO, $TiO_2$, TaO, $TaO_2$, $Ta_2O_6$, $Ta_2O_5$, $Ta_2O_4$, $Ta_2O_3$, $Ta_2O_2$, or $Ta_2O$; and the second resistance switching layer is $SrTiO_3$, $SrZrO_3$, NiO, $TiO_2$, TaO, $TaO_2$, $Ta_2O_6$, $Ta_2O_5$, $Ta_2O_4$, $Ta_2O_3$, $Ta_2O_2$, or $Ta_2O$.

3. The ReRAM device according to claim 1, wherein the first resistance switching layer is $Ta_2O_6$, $Ta_2O_5$, $Ta_2O_4$, $Ta_2O_3$, $Ta_2O_2$, or $Ta_2O$; and the second resistance switching layer is $TaO_2$ or TaO.

4. The ReRAM device according to claim 1, wherein a depth of the first groove is ½-⅘ of a thickness of the first resistance switching layer; and a thickness of a part outside the first groove of the second resistance switching layer is 1-1.5 times the depth of the first groove.

5. The ReRAM device according to claim 1, wherein a depth of the second groove is ½-⅘ of a thickness of a part outside the first groove of the second resistance switching layer.

6. The ReRAM device according to claim 1, wherein a material of a surface of the top electrode in contact with the top surface of the second resistance switching layer is Ag, Pt, Ta, Ti, or TiN; and a material of a surface of the bottom electrode in contact with the bottom surface of the first resistance switching layer is Ag, Pt, Ta, Ti, or TiN.

7. A method for manufacturing the ReRAM device according to claim 1, comprising:

step 1: performing a metal layer process to form a metal layer of the bottom electrode of the ReRAM device on a wafer, the wafer outside a central area of the metal layer of the bottom electrode of the ReRAM device being covered with an isolation dielectric layer;

step 2: sequentially depositing a bottom electrode contact surface layer and the first resistance switching layer on the metal layer of the bottom electrode of the ReRAM device and the isolation dielectric layer, the first groove being formed in the first resistance switching layer right above the bottom electrode;

step 3: depositing the second resistance switching layer;

step 4: performing etching to remove the second resistance switching layer, the first resistance switching layer, and the bottom electrode contact surface layer which cover the isolation dielectric layer outside the metal layer of the bottom electrode and an adjoining area thereof, and reserve the second resistance switching layer, the first resistance switching layer, and the bottom electrode contact surface layer which cover positions right above the metal layer of the bottom electrode and the adjoining area thereof;

step 5: depositing a top electrode contact surface layer; and step 6: performing etching to remove the top electrode contact surface layer on outer sides of the second resistance switching layer, the first resistance switching layer, and the bottom electrode contact surface layer.

8. The method for manufacturing the ReRAM device according to claim 7, wherein after step 2, the first resistance switching layer in the center right above the metal layer of the bottom electrode is etched firstly to widen the transverse dimension of the first groove and/or deepen a depth of the first groove, and then step 3 is performed.

9. The method for manufacturing the ReRAM device according to claim 7, wherein the isolation dielectric layer is SiN;

the first resistance switching layer is $Ta_2O_6$, $Ta_2O_5$, $Ta_2O_4$, $Ta_2O_3$, $Ta_2O_2$, or $Ta_2O$;

the second resistance switching layer is $TiO_2$ or TaO;

the bottom electrode contact surface layer is formed of Ta, Ti, or TiN; and the top electrode contact surface layer is formed of Ta, Ti, or TiN.

\* \* \* \* \*